United States Patent
Park et al.

(10) Patent No.: US 8,284,603 B2
(45) Date of Patent: Oct. 9, 2012

(54) MEMORY DEVICES AND OPERATIONS THEREOF USING PROGRAM STATE DETERMINATION BASED ON DATA VALUE DISTRIBUTION

(75) Inventors: Kitae Park, Seongnam-si (KR); Jinman Han, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 382 days.

(21) Appl. No.: 12/748,113

(22) Filed: Mar. 26, 2010

(65) Prior Publication Data

US 2010/0315876 A1  Dec. 16, 2010

(30) Foreign Application Priority Data

Jun. 12, 2009 (KR) .................. 10-2009-0052397

(51) Int. Cl.
*G11C 11/34* (2006.01)

(52) U.S. Cl. ............................. 365/185.12; 365/185.17

(58) Field of Classification Search .................. None
See application file for complete search history.

(56) References Cited

U.S. PATENT DOCUMENTS

| 7,016,226 | B2* | 3/2006 | Shibata et al. | 365/185.03 |
|---|---|---|---|---|
| 7,085,167 | B2* | 8/2006 | Lee et al. | 365/185.22 |
| 7,362,610 | B1* | 4/2008 | Salter et al. | 365/185.02 |
| 2008/0144380 | A1 | 6/2008 | Youn et al. | |
| 2008/0239805 | A1 | 10/2008 | Shiga et al. | |
| 2009/0031074 | A1 | 1/2009 | Son | |
| 2009/0259803 | A1 | 10/2009 | Oh et al. | |

FOREIGN PATENT DOCUMENTS

| JP | 2008-084485 | 4/2008 |
|---|---|---|
| JP | 2009-032261 | 2/2009 |
| KR | 100784867 B1 | 12/2007 |
| KR | 1020080029861 A | 4/2008 |
| KR | 1020090011773 A | 2/2009 |

* cited by examiner

*Primary Examiner* — Alexander Sofocleous

(74) *Attorney, Agent, or Firm* — Myers Bigel Sibley & Sajovec, P.A.

(57) ABSTRACT

In a memory device, a proportion of at least one cell state in a unit of the memory is determined. A program state of the unit of the memory is determined based on the determined proportion of the at least one cell state. Determining a proportion of at least one cell state in a unit of the memory may be preceded by processing data to be stored in the unit of the memory according to a data value distribution function to produce transformed data having data values conforming to a predetermined distribution and storing the transformed data in the unit of the memory. The distribution function may be configured, for example, to provide a uniform distribution of data values in the unit of the memory.

28 Claims, 14 Drawing Sheets

US 8,284,603 B2

MEMORY DEVICES AND OPERATIONS THEREOF USING PROGRAM STATE DETERMINATION BASED ON DATA VALUE DISTRIBUTION

CROSS-REFERENCE TO RELATED APPLICATIONS

This application claims the benefit of Korean Patent Application No. 10-2009-0052397, filed Jun. 12, 2009, in the Korean Intellectual Property Office, the disclosure of which is incorporated herein by reference in its entirety.

BACKGROUND

The present invention relates to memory devices and methods of operation thereof and, more particularly, to program state determination in memory devices.

Typical flash memory devices include an array of cells including floating gate transistors having threshold voltages corresponding to data values. For example, FIG. 1 illustrates a conventional flash memory device 22 including a memory cell array 222 comprising respective strings of floating gate transistors connected to respective bit lines BL0, BL1, BL2, ..., BLn-2, BLn-1. Gate electrodes of respective rows of the transistors are connected to respective word lines WL0, WL1, ..., WLm-3, WLm-2, WLm-1.

Respective string select lines SSL and ground select lines GSL control connection of the strings to the bit lines BL0, BL1, BL2, ..., BLn-2, BLn-1 and a column select line CSL. The array 222 further includes flag cells 223 that are configured to store flag data indicative of a program state of the corresponding memory cells. The flag values are provided by flag bit lines FBL0, FBL1, ..., FBLk-1.

The bit lines BL0, BL1, BL2, ..., BLn-2, BLn-1 and flag bit lines FBL0, FBL1, ..., FBLk-1 are driven by a page buffer 226, while the word lines WL0, WL1, ..., WLm-3, WLm-2, WLm-1, string select lines SSL and ground select lines GSL are driven by row decoder 224. Control logic 228 controls the page buffer 226 and the row decoder 224.

As noted above, flag cells may be used to store information about the program state of the memory cells. For example, flag cells may be written to as the memory cells are programmed. For example, in a device in which memory cells are used to store 2 bit values, a flag cell value of "0" may indicate that an LSB of the cells has not been programmed, while a flag cell value of "1" may indicate that the LSB is programmed. In a read operation, a flag cell value of "1" may indicate that the LSB may be read. In a write operation, a flag cell value of "1" may indicate that the MSB may now be programmed. As the number of bits stored by the each memory cell increases, a greater number of flag cells is used to indicate program state.

SUMMARY

Some embodiments of the present invention provide methods of operating a memory including a plurality of memory cells. In these methods, a proportion of at least one cell state in a unit of the memory is determined. A program state of the unit of the memory is determined based on the determined proportion of the at least one cell state. Determining a proportion of at least one cell state in a unit of the memory may be preceded by processing data to be stored in the unit of the memory according to a data value distribution function to produce transformed data having data values conforming to a predetermined distribution and storing the transformed data in the unit of the memory. The distribution function may be configured, for example, to provide a uniform distribution of data values in the unit of the memory. The distribution function may be configured to randomize distribution of values in the unit of the memory. In further embodiments, determining a program state of the unit of the memory based on the determined proportion of the at least one cell state includes determining the program state based on a weighting associated with the distribution function.

Determining a proportion of at least one cell state in a unit of the memory may include determining a proportion of cells in the unit having a threshold voltage meeting a predetermined criterion. Determining a proportion of at least one cell state in a unit of the memory may include determining a proportion of cells having an erased state. Determining a program state of the unit of the memory based on the determined proportion of cell states may include determining a number of cells in the unit having a predetermined state and determining the program state by comparison of the determined number of cells to a predetermined criterion.

In additional embodiments, determining a program state of the unit of the memory based on the determined proportion of the at least one cell state may include determining the program state of the unit of the memory based on the determined proportion of the at least one cell state without determining a status of a program state flag. In further embodiments, determining a program state of the unit of the memory based on the determined proportion of the at least one cell state may include determining the program state of the unit of the memory based on the determined proportion of the at least one cell state responsive to a failure to identify the program state of the unit based on a program state flag.

In yet further embodiments, the unit of the memory may include a plurality of multi-bit memory cells. Determining a program state of the unit of the memory based on the determined proportion of the at least one cell state may include determining a program state of the unit of the memory for a first bit level based on the determined proportion of the at least one cell state. The methods may further include determining a program state of the unit of the memory for a second bit level based on a program state flag.

In additional embodiments, methods may further include determining a state of a program state flag of the unit of the memory. Determining a program state of the unit of the memory based on the determined proportion of the at least one cell state may include determining the program state of the unit of the memory based on the determined proportion of the at least one cell state and the determined state of the program state flag.

Methods according to further embodiments may further include controlling a read operation and/or a write operation responsive to the determined program state.

Additional embodiments of the present invention provide memory systems. A memory system may include a memory including a plurality cells and a program state determiner circuit configured to determine a proportion of at least one cell state in a unit of the memory and to determine a program state of the unit of the memory based on the determined proportion of the at least one cell state. The memory system may further include a data value converter circuit configured to process data to be stored in the unit of the memory according to a data value distribution function to produce transformed data having data values conforming to a predetermined distribution, and the memory may be configured to store the transformed data in the unit of the memory.

BRIEF DESCRIPTION OF THE DRAWINGS

Exemplary embodiments of the present invention will be more clearly understood from the following detailed description taken in conjunction with the accompanying drawings in which.

DETAILED DESCRIPTION OF EMBODIMENTS

Some embodiments of the present invention will now be described hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like items throughout.

It will be understood that when an item is referred to as being "connected" or "coupled" to another item, it can be directly connected or coupled to the other item or intervening items may be present. In contrast, when an item is referred to as being "directly connected" or "directly coupled" to another item, there are no intervening items present. As used herein, the term "and/or" includes any and all combinations of one or more of the associated listed items and may be abbreviated as "/".

It will be understood that, although the terms first, second, etc. may be used herein to describe various items, these items should not be limited by these terms. These terms are only used to distinguish one item from another. For example, a "first" item could be termed a "second" item, and, similarly, a "second" item could be termed a "first" item without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated items or operations but do not preclude the presence or addition of one or more other items or operations.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
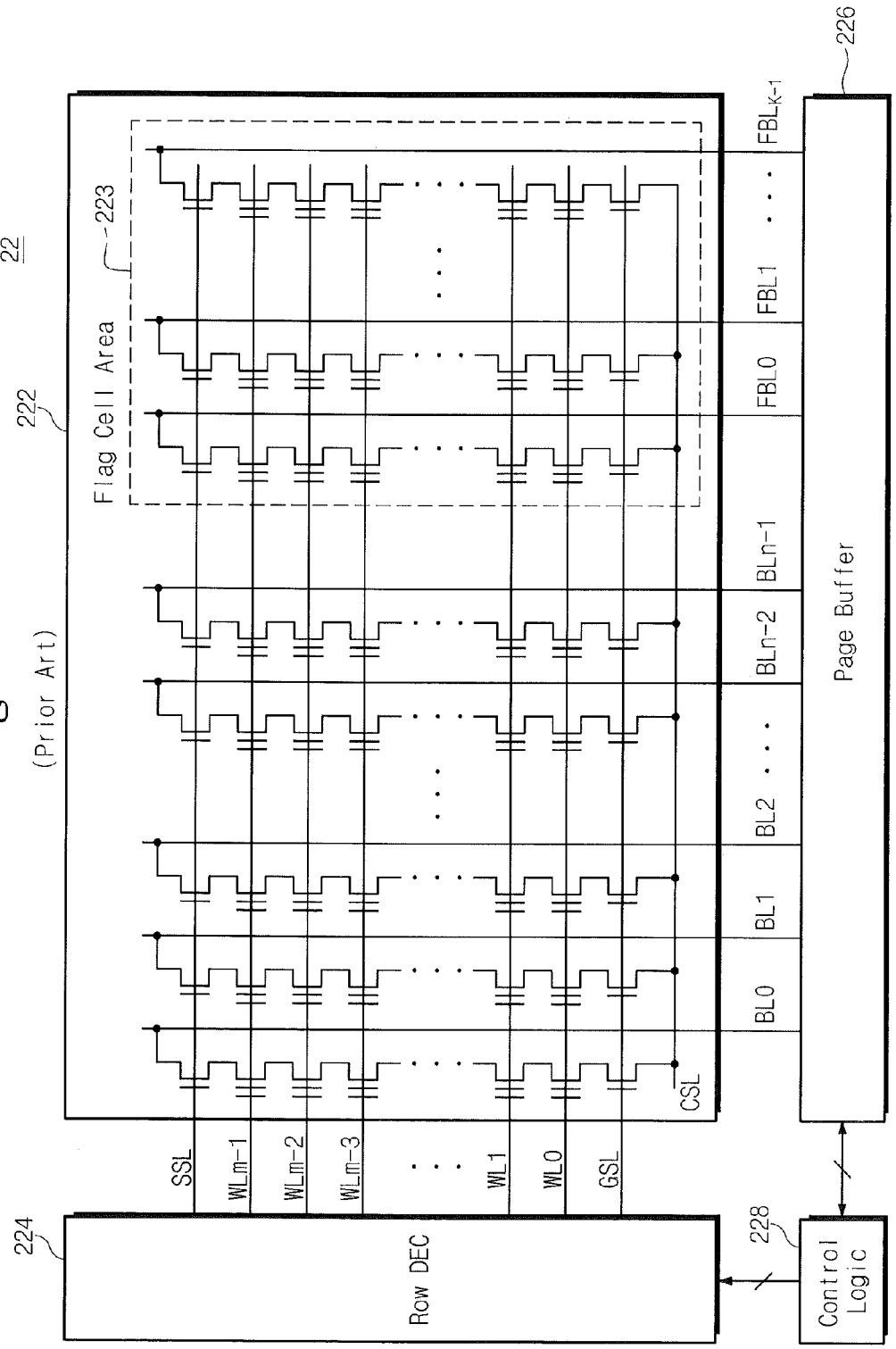
FIG. 1 is a block diagram of a conventional flash memory device.
Figure 2:
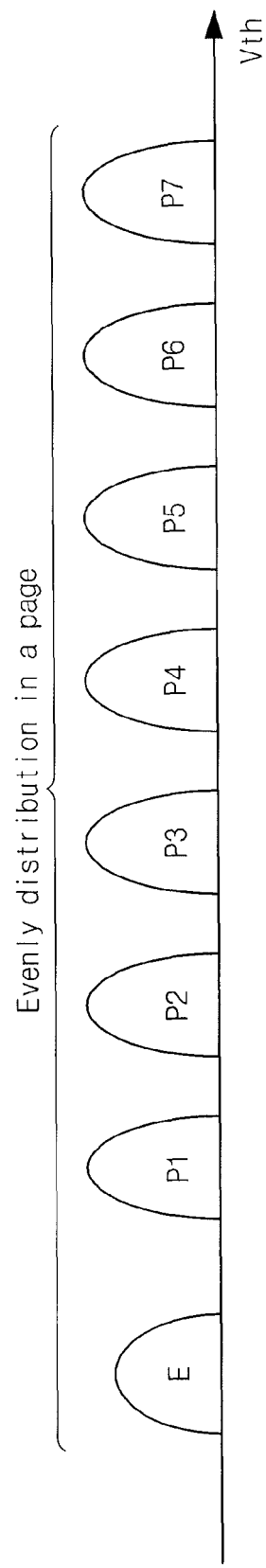
FIG. 2 is a graph illustrating distribution of threshold voltage values in a conventional flash memory device utilizing a value distribution function.
Figure 3:
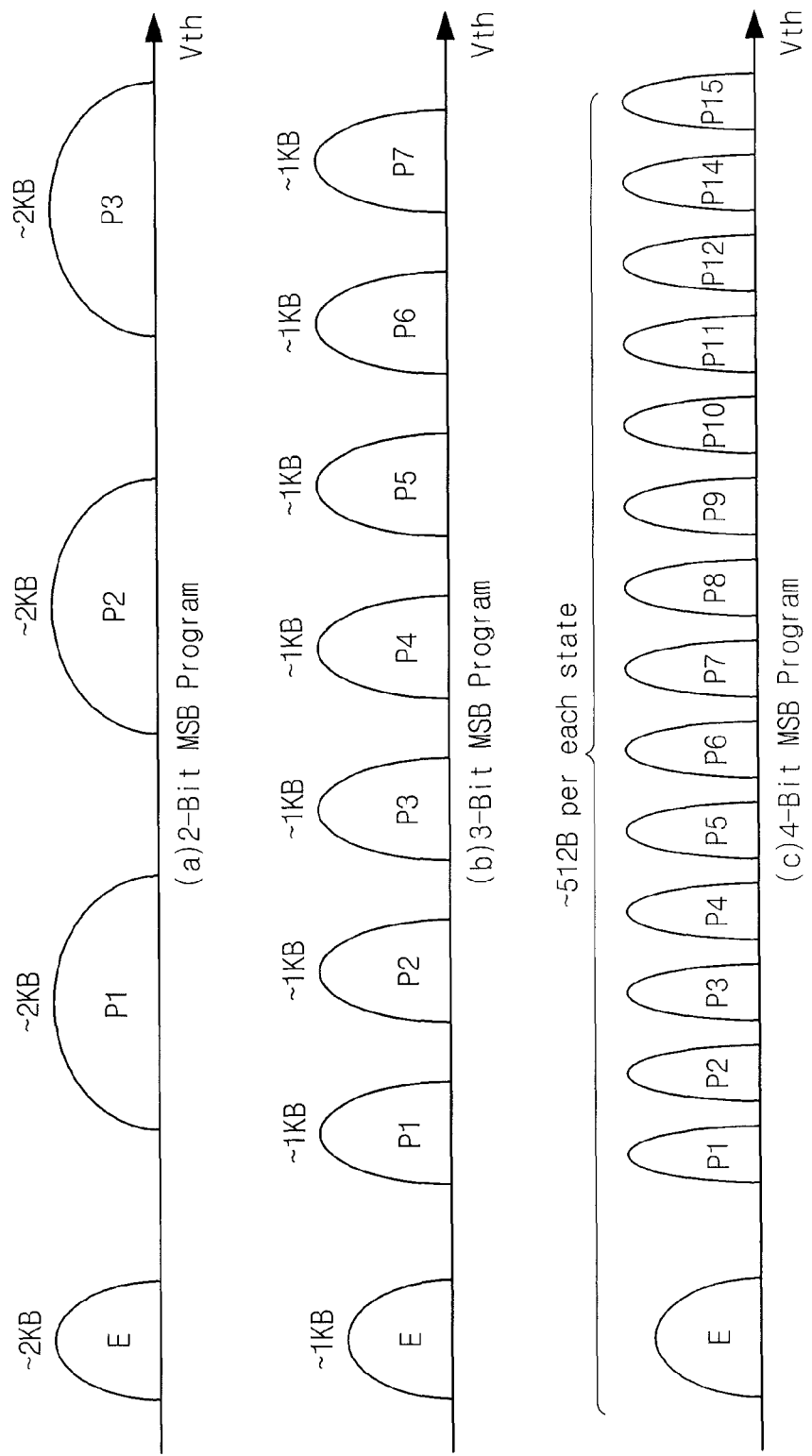
FIG. 3 is a graph illustrating distribution of threshold voltage values in conventional multi-level cell (MLC) flash memory device utilizing a value distribution function at various stages of programming.

As described in U.S. patent application Ser. No. 12/410,150 filed Mar. 24, 2009, also published as U.S. Patent Application Publication No. 20090259803, values to be stored in a memory cell array may be processed according to a distribution function (referred to as a "randomizer") such that threshold voltages in the array have a predetermined, e.g., uniform, distribution. For example, as shown in FIG. 2, in an array providing single level cells (SLCs), such a distribution function may result in providing substantially equal numbers of cells having threshold voltages Vth falling within 8 "bins" E (erased), P1, P2, . . . , P7. As shown in FIG. 3, for an array configured to provide 3-bit multi-level cell (MLC) data storage, successive programming operations provide threshold voltage distributions of 4, 8, and 16 bins.

Some embodiments of the present invention arise from a realization that such data value distribution functions can enable use of streamlined techniques for determining the program state of a flash memory device. In particular, as the threshold voltage distribution associated with a programmed device may be known a priori, relatively efficient techniques for determining threshold voltage distribution in the device can be used to determine the program state of the device in read and/or write operations.

Figure 4:
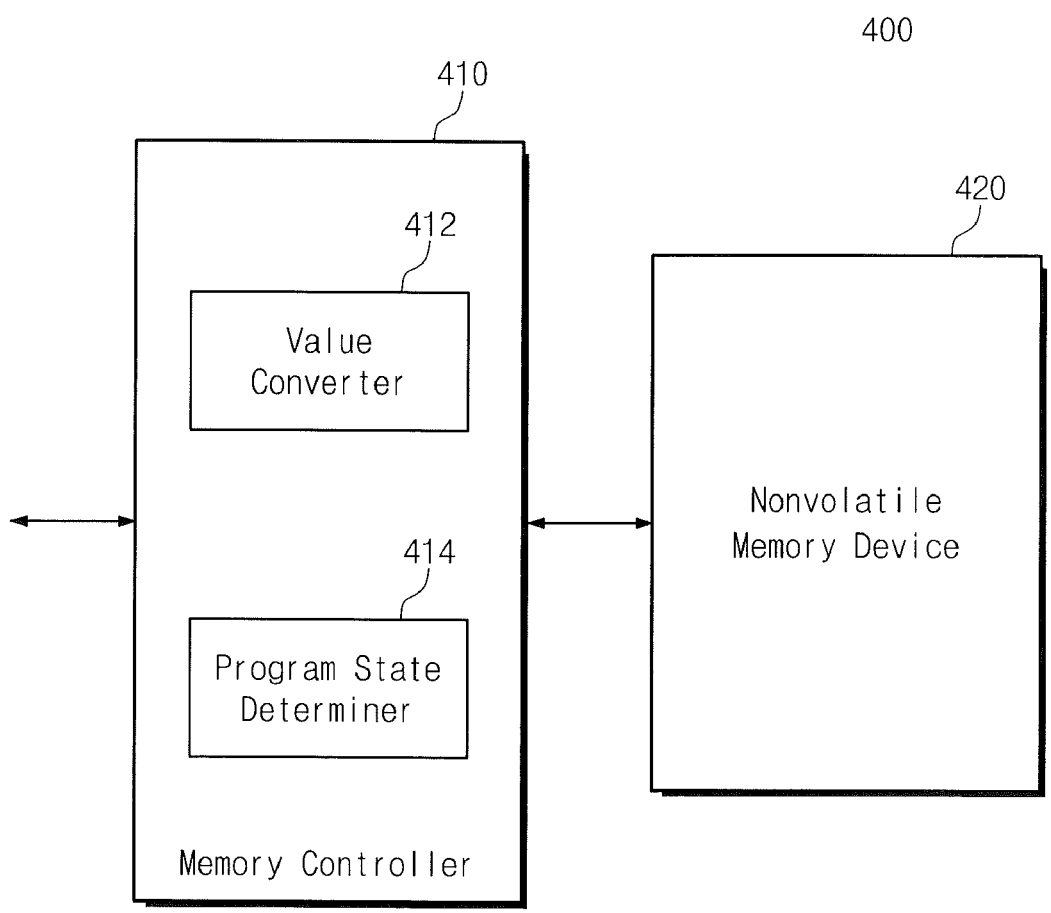
FIG. 4 is a block diagram of a memory system according to some embodiments of the present invention.

FIG. 4 illustrates a memory system 400 according to some embodiments of the present invention. The memory system 400 includes a nonvolatile memory device 420 (e.g., a flash memory device) controlled by a memory controller circuit 410. The memory controller circuit 410 includes a value converter circuit 412 that is configured to convert received values to be stored in the memory device 420 according to a data value distribution function, such as a function that provides a substantially uniform distribution of values in the memory device 420, and that provides the converted values to the memory device 420 for storage therein. The value converter circuit 412 may be further configured to convert values retrieved from the memory device 420 according to an inverse of the data value distribution function to provide corrected values to an external recipient. The memory controller circuit 410 further includes a program state determiner circuit 414 configured to determine a program state of the memory device 420.

Figure 5:
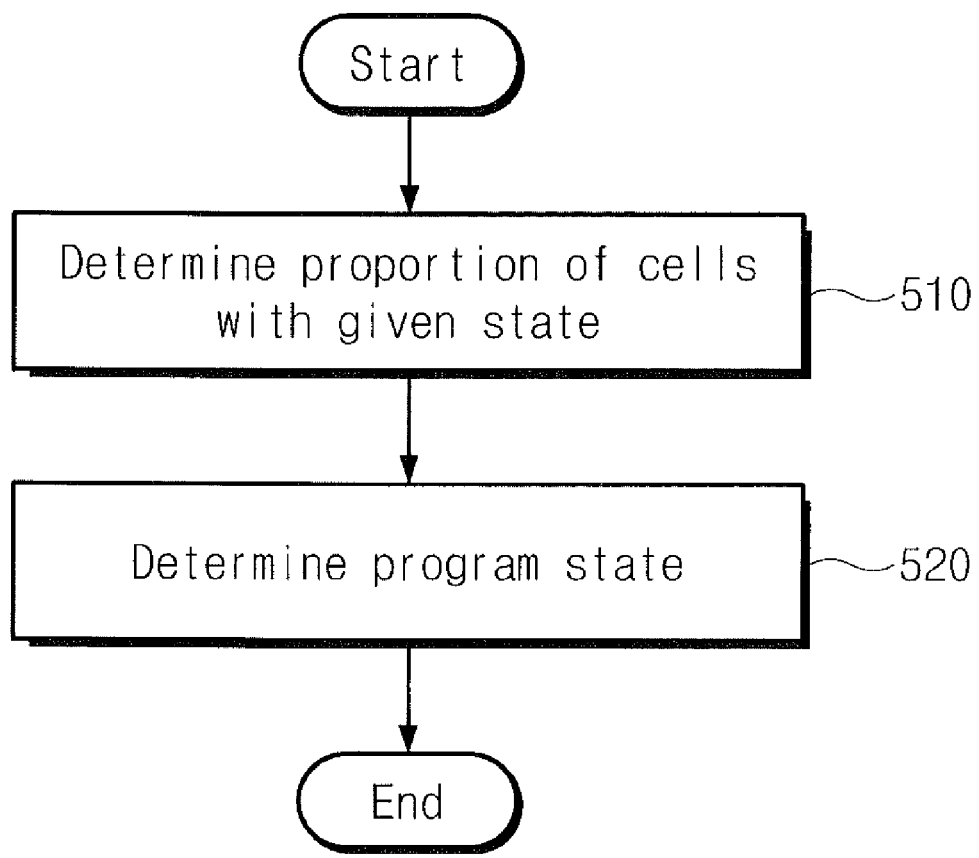
FIG. 5 is a flowchart illustrating operations for determining a program state in a memory device according to some embodiments of the present invention.

As shown in FIG. 5, the program state determiner circuit 414 may determine a proportion of cells in the memory device having a given state, e.g., falling within a given range of threshold voltages (block 510), and may responsively determine the program state of the device based thereon (block 520). For example, referring to the uniform distribution of FIG. 2, the number of cells in a unit (e.g., a page or sector) of the memory device that have threshold voltages corresponding to an erased state E may be counted and, knowing that the number of such cells should be approximately one-eighth of the total number of cells, it may be determined whether the device has been programmed. In particular, the number of cells having the erased value may be compared to a predetermined threshold (which may include an error tolerance) to determine whether or not the device has been programmed. In this manner, program state may be determined without the use of flag cells. It will be appreciated that distribution functions other than the uniform distribution functions shown in FIGS. 2 and 3 may be used, and that the comparison threshold may be determined based on the weighting the distribution functions places on particular values.

Figure 6:
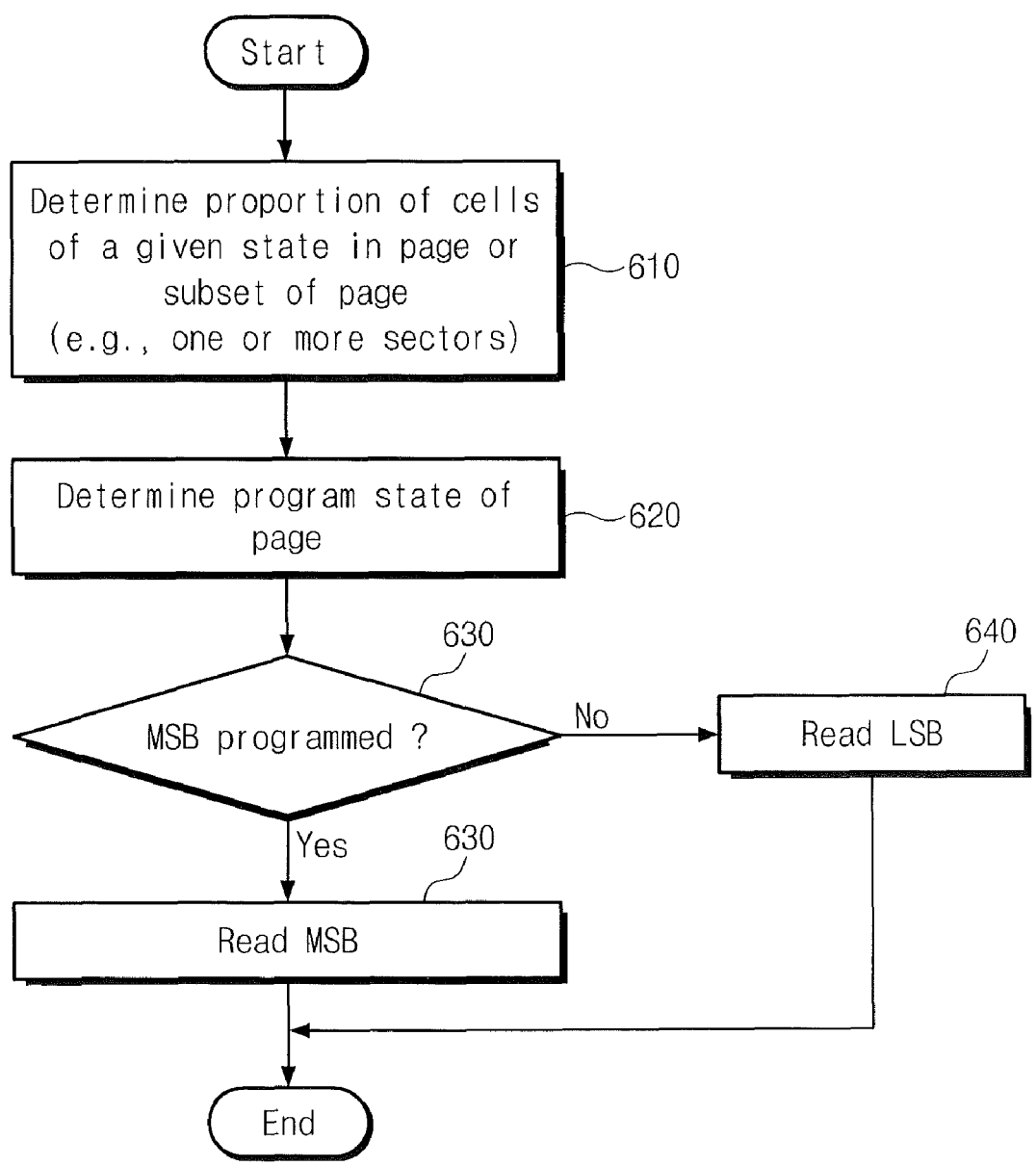
FIG. 6 is a flowchart illustrating operations for determining a program state in a memory device according to further embodiments of the present invention.

According to further embodiments, cells in a unit, e.g., a page or sector, of a memory device may be sampled to determine a number of cells having a predetermined value, such as an erased value, to determine a program state of the page to control a read operation. Referring to FIG. 6, a proportion of cells in one or more sectors of a page having a particular value is determined (block 610). For example, the number of cells in one or more sectors of a page having an erased state may be determined and compared to a predetermined threshold number. A program state of the page may be determined based on the determined proportion of cells that have the predetermined value in the one or more sectors (block 620). If the determined proportion indicates that a most significant bit (MSB) has been programmed, the MSB may be read (blocks 630, 650). If the proportion indicates that the MSB has not been programmed, the MSB read operation may be skipped and the least significant bit (LSB) may be read (blocks 630, 640). According to further embodiments, instead of reading one or more selected sectors, a scan read operation may be performed on the entire page to determine a program state for use in controlling a read operation.

Figure 7:
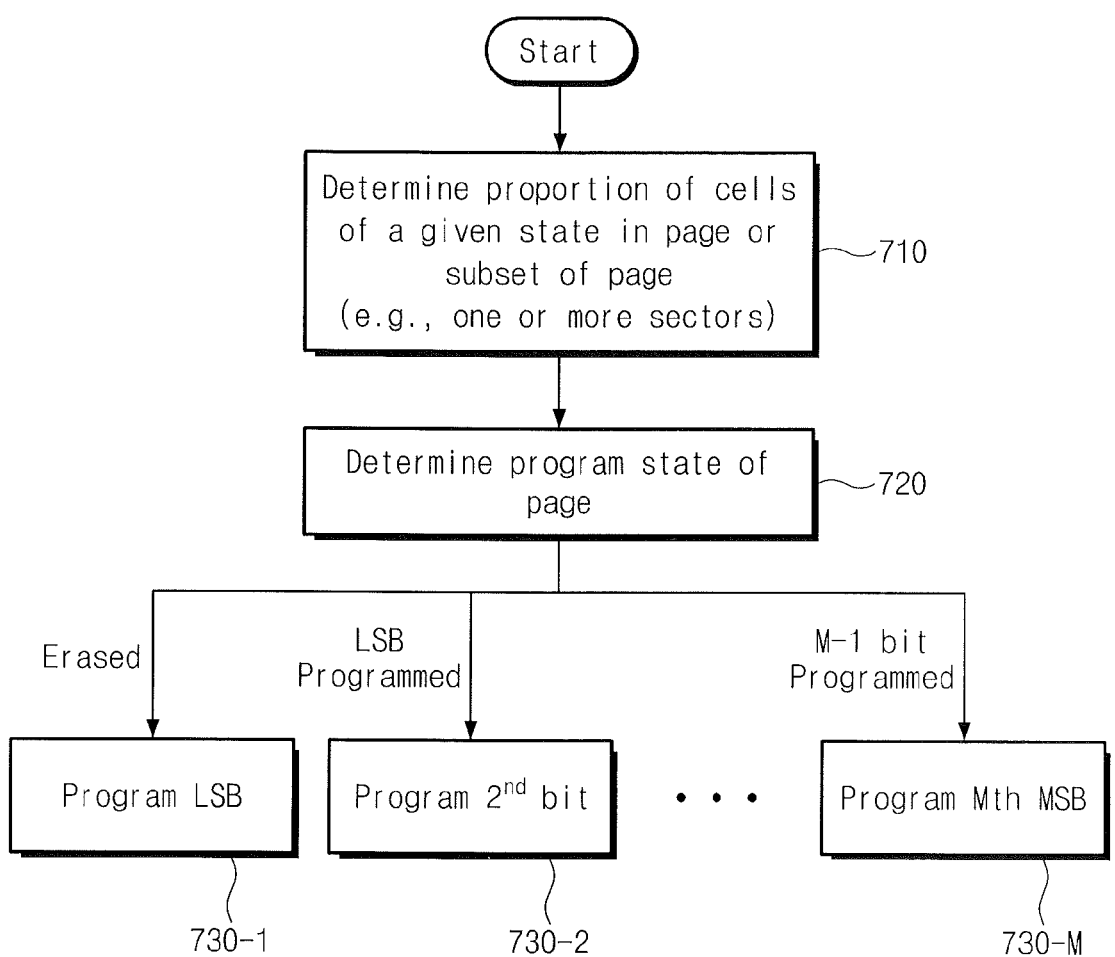
FIG. 7 is a flowchart illustrating operations for determining a program state in a memory device according to some embodiments of the present invention.

According to further embodiments, a proportion of cells states may be determined to determine a program state for purposes of controlling a MLC programming operation. Referring to FIG. 7, a page or subset thereof is read to determine a proportion of cells having a given state (block 710). The program state of the page is determined based on the determined proportion (block 720). If the program state indicates an erased stated, an LSB may be programmed (block 730-1). If it is determined that the LSB is programmed, a next most significant bit may be programmed (block 730-2). Similar operations may be performed for an Mth MSB (block 730-M).

Figure 8:
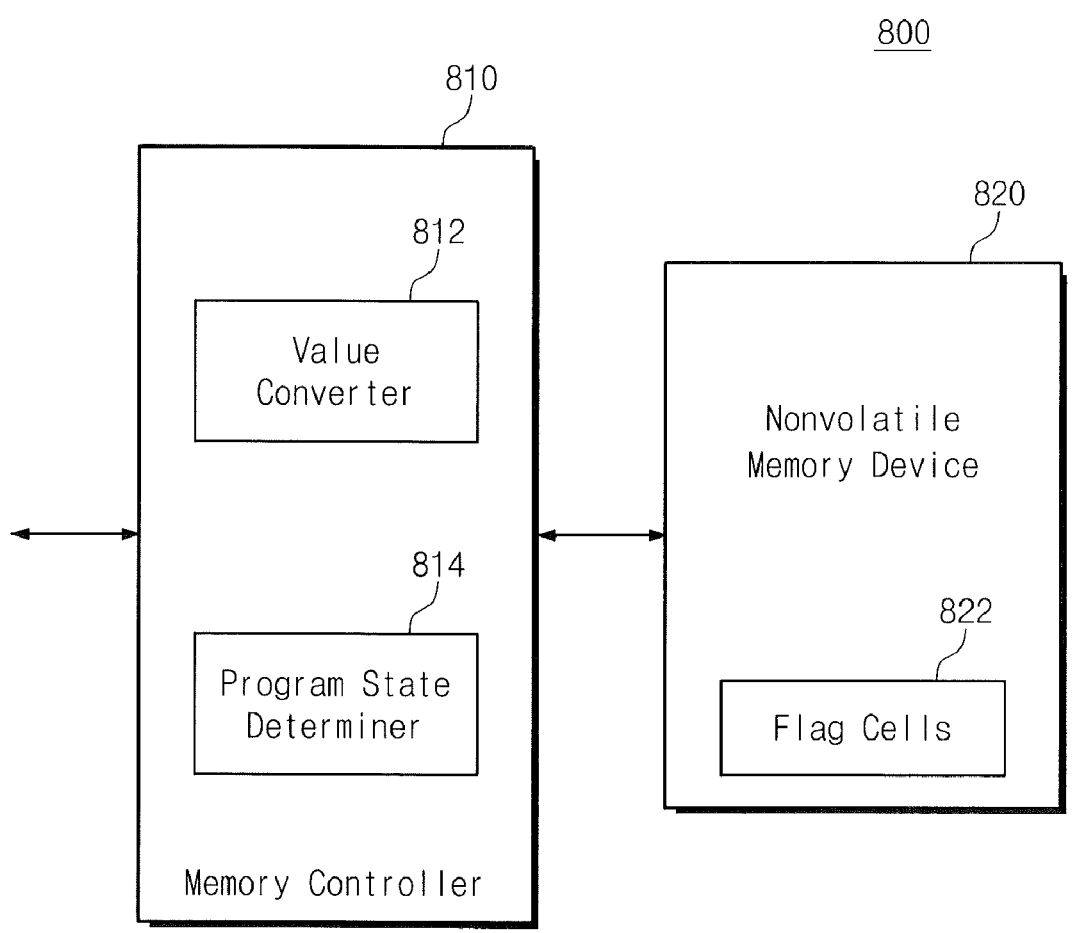
FIG. 8 is a block diagram of a memory system according to additional embodiments of the present invention.

According to further embodiments of the present invention, operations using a priori knowledge of value distribution may be combined with the use of flag cells. Referring to FIG. 8, in a memory system 800, a memory device 820 includes flag cells 822. A memory controller circuit 812 includes a value converter circuit 812 (e.g., a circuit along the lines of the value converter circuit 412 of FIG. 4) and program state determiner circuit 814.

Figure 9:
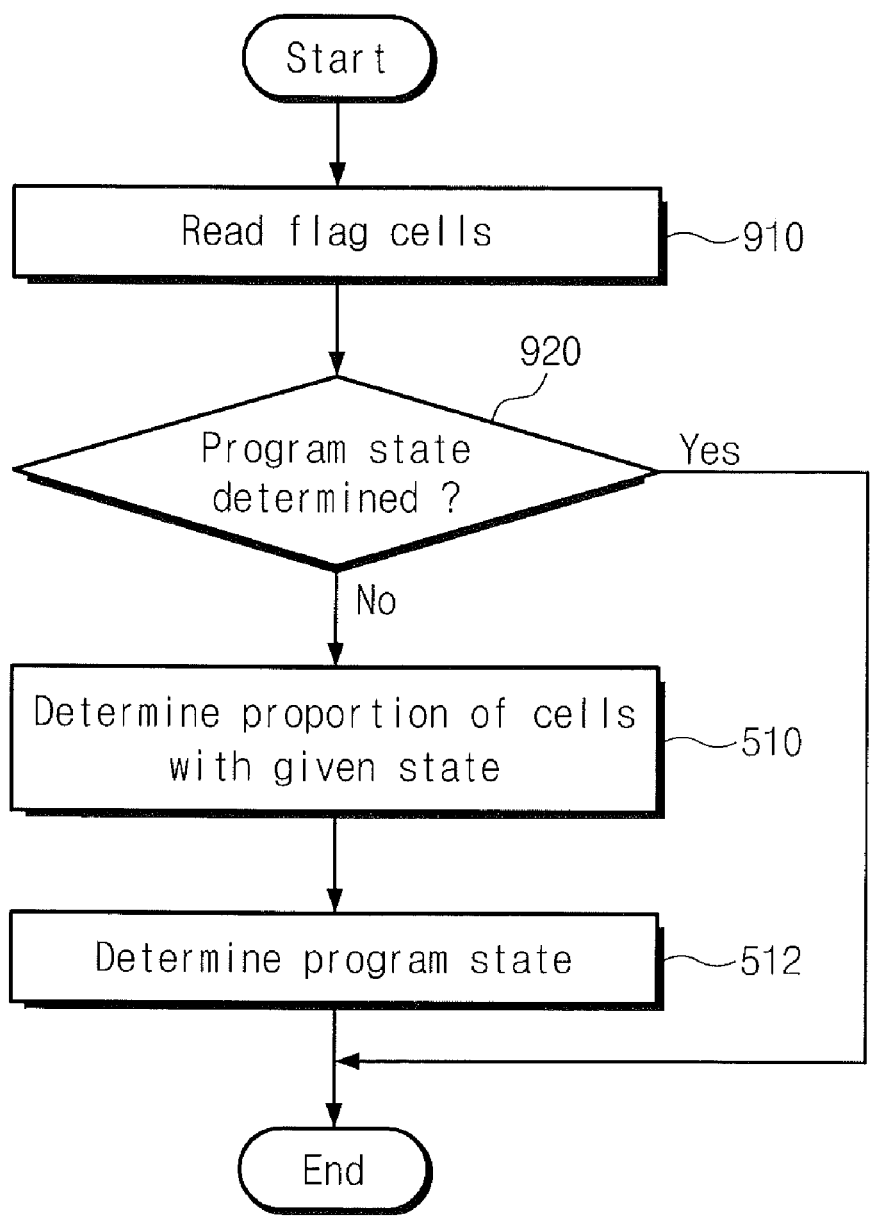
FIG. 9 is a flowchart illustrating operations for determining a program state in a memory device according to some embodiments of the present invention.

Referring to FIG. 9, the program state determiner circuit 814 may first read the flag cells 822 to attempt to determine a program state of the memory device 820 (block 910). If reading of the flag cells 822 gives an indeterminate answer as to the program state, however, the program determiner circuit 814 may determine a proportion of cells having a predetermined value and use this information to determine the program state using techniques along the lines discussed above (blocks 920, 930, 940). In other embodiments, program state determinations generated by reading flag cells and by determining data values proportions may be combined to estimate a program state. In still further embodiments, a hybrid approach may be used wherein the flag cells 822 may be used for selected bits, while techniques involving determining data value proportions along the lines discussed above may be used for other bits. For example, flag cells may be used to indicate LSB programming state, while data value proportion techniques may be used to determine higher order bit program status.

Figure 10:
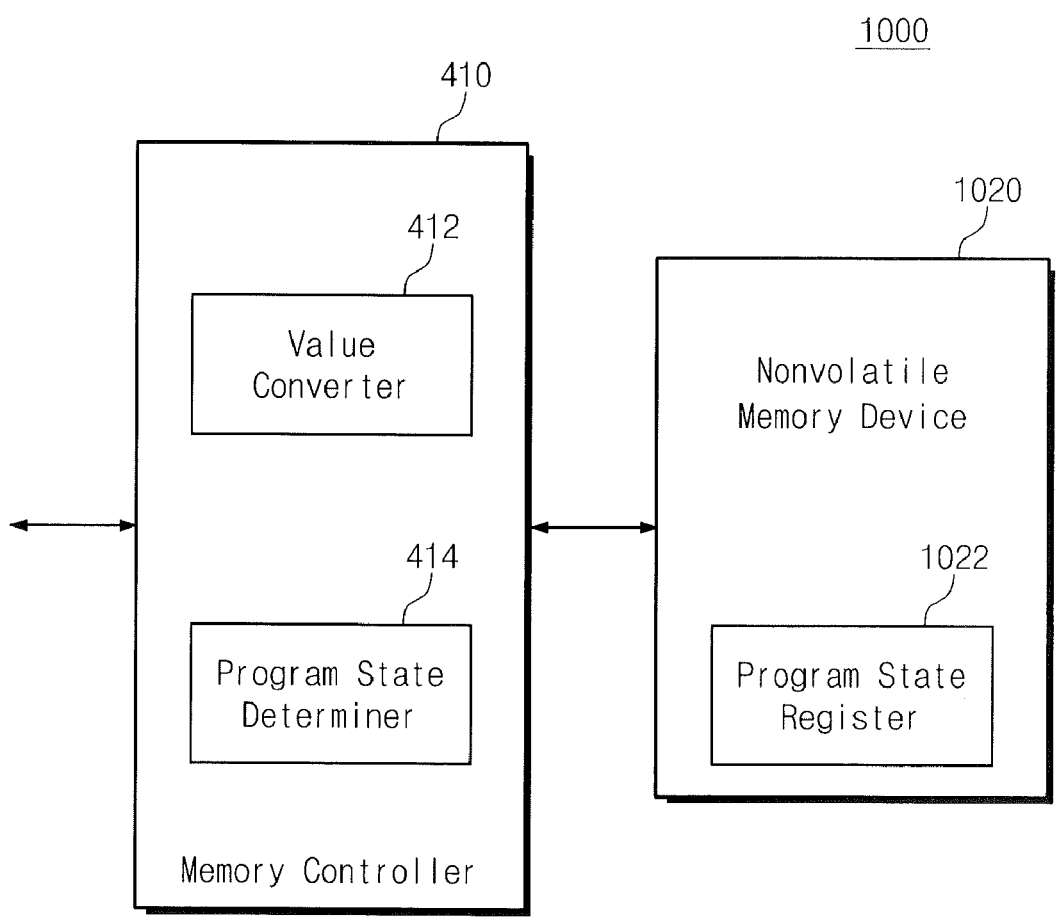
FIG. 10 is a block diagram of a memory system according to further embodiments of the present invention.

Referring to FIG. 10, in a memory system 1000 according to further embodiments of the present invention, a program state register 1022 may be included in a memory device 1020 for storing program state information generated by a program state determiner circuit 414 in a memory controller circuit 410, which may operate along lines discussed above with reference to FIG. 4. The program state register 1022 may be accessed by the memory controller circuit 410 to retrieve program state information for use in controlling read and/or write operations.

Figure 11:
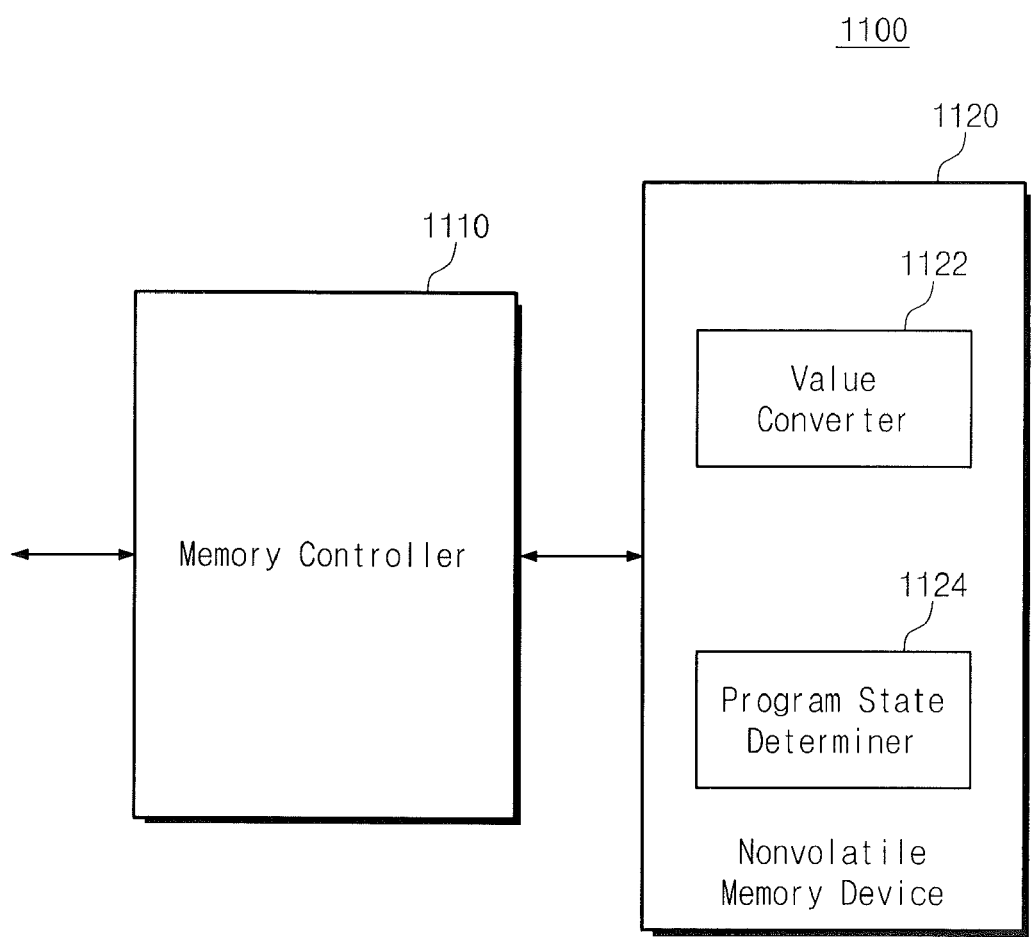
FIG. 11 is a block diagram of a memory system according to additional embodiments of the present invention.
Figure 12:
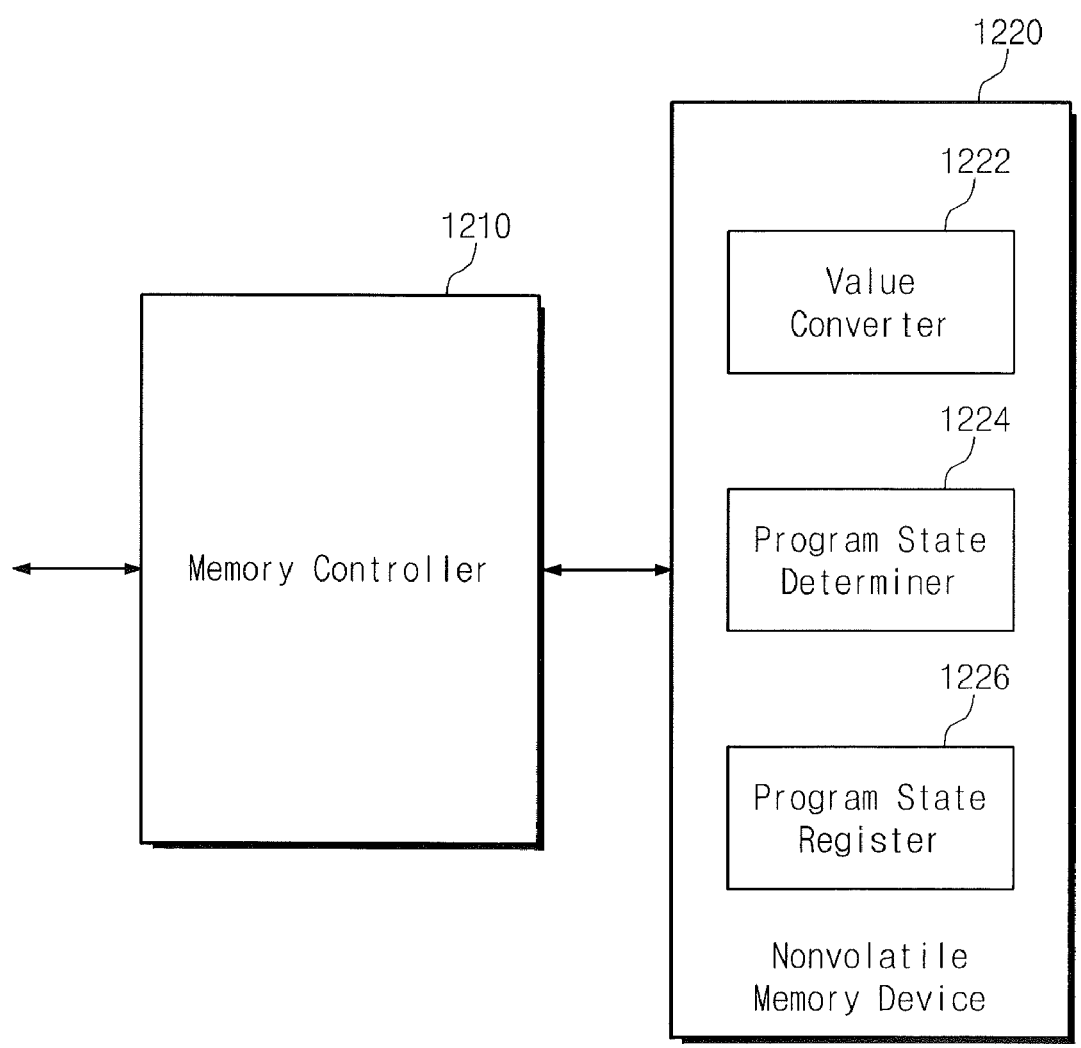
FIG. 12 is a block diagram of a memory system according to additional embodiments of the present invention.

In embodiments illustrated in FIG. 11, a memory system 1000 may include a memory device 1120 controlled by a memory controller circuit 1110, wherein the memory device 1120 includes an integrated value converter circuit 1122 and program state determiner circuit 1124. Referring to FIG. 12, a memory system 1200 may include a memory device 1220 controlled by a memory controller circuit 1210, wherein the memory device 1220 includes an integrated value converter circuit 1222, program state determiner circuit 1224 and a program state register 1226.

Figure 13:
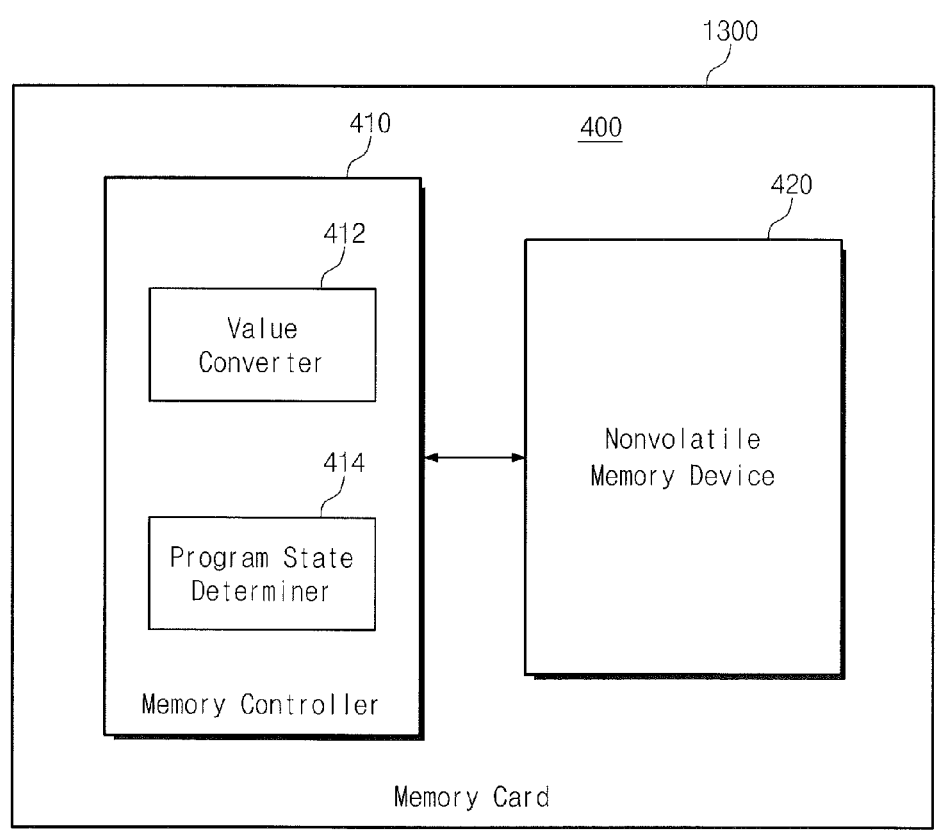
FIG. 13 is a block diagram of a memory card according to some embodiments of the present invention.
Figure 14:
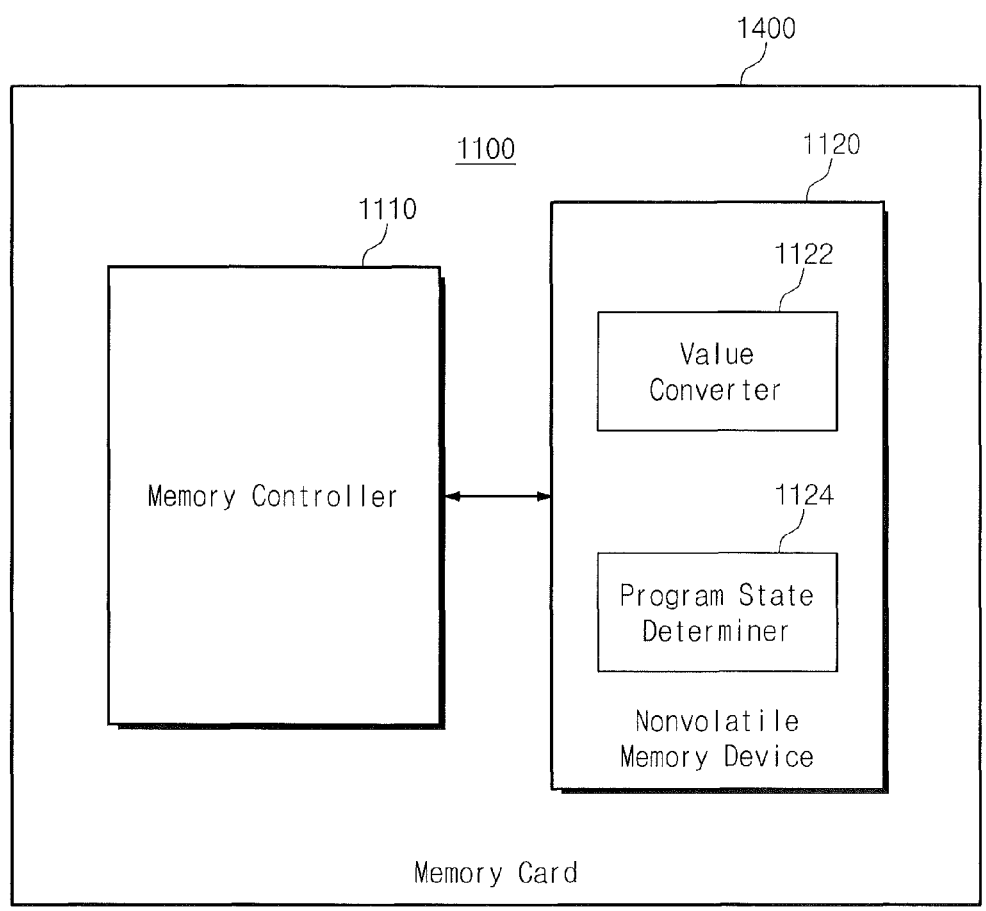
FIG. 14 is a block diagram of a memory card according to additional embodiments of the present invention.

FIG. 13 illustrates an application according to further embodiments wherein a memory system 400 along the lines of FIG. 4 is included in a memory card 1300. FIG. 14 illustrates another application in which a memory system 1100 along the lines of FIG. 11 is included in a memory card 1400.

While the present invention has been particularly shown and described with reference to exemplary embodiments thereof, it will be understood that various changes in form and details may be made therein without departing from the spirit and scope of the following claims.

What is claimed is:

1. A method of operating a memory comprising a plurality of memory cells, the method comprising:
   determining a proportion of at least one cell state in a unit of the memory;
   determining a program state of the unit of the memory based on the determined proportion of the at least one cell state.

2. The method of claim 1, wherein determining a proportion of at least one cell state in a unit of the memory is preceded by:
   processing data to be stored in the unit of the memory according to a data value distribution function to produce transformed data having data values conforming to a predetermined distribution; and
   storing the transformed data in the unit of the memory.

3. The method of claim 2, wherein determining a program state of the unit of the memory based on the determined proportion of the at least one cell state comprises determining the program state based on a weighting associated with the distribution function.

4. The method of claim 2, wherein the distribution function is configured to provide a uniform distribution of data values in the unit of the memory.

5. The method of claim 2, wherein the distribution function is configured to randomize distribution of values in the unit of the memory.

6. The method of claim 1, wherein determining a proportion of at least one cell state in a unit of the memory comprises determining a proportion of cells in the unit having a threshold voltage meeting a predetermined criterion.

7. The method of claim 1, wherein determining a proportion of at least one cell state in a unit of the memory comprises determining a proportion of cells having an erased state.

8. The method of claim 1, wherein determining a program state of the unit of the memory based on the determined proportion of cell states comprises:
   determining a number of cells in the unit having a predetermined state; and
   determining the program state by comparison of the determined number of cells to a predetermined criterion.

9. The method of claim 1, wherein determining a program state of the unit of the memory based on the determined proportion of the at least one cell state comprises determining the program state of the unit of the memory based on the determined proportion of the at least one cell state without determining a status of a program state flag.

10. The method of claim 1, wherein determining a program state of the unit of the memory based on the determined proportion of the at least one cell state comprises determining the program state of the unit of the memory based on the determined proportion of the at least one cell state responsive to a failure to identify the program state of the unit based on a program state flag.

11. The method of claim 1:
   wherein the unit of the memory comprises a plurality of multi-bit memory cells;
   wherein determining a program state of the unit of the memory based on the determined proportion of the at least one cell state comprises determining a program state of the unit of the memory for a first bit level based on the determined proportion of the at least one cell state; and
   wherein the method further comprises determining a program state of the unit of the memory for a second bit level based on a program state flag.

12. The method of claim 1, further comprising determining a state of a program state flag of the unit of the memory and wherein determining a program state of the unit of the memory based on the determined proportion of the at least one cell state comprises determining the program state of the unit of the memory based on the determined proportion of the at least one cell state and the determined state of the program state flag.

13. The method of claim 1, further comprising controlling a read operation and/or a write operation responsive to the determined program state.

14. A memory system comprising:
   a memory comprising a plurality cells; and
   a program state determiner circuit configured to determine a proportion of at least one cell state in a unit of the memory and to determine a program state of the unit of the memory based on the determined proportion of the at least one cell state.

15. The system of claim 14, further comprising a data value converter circuit configured to processing data to be stored in the unit of the memory according to a data value distribution function to produce transformed data having data values conforming to a predetermined distribution wherein the memory is configured to store the transformed data in the unit of the memory.

16. The system of claim 15, wherein the program state determiner circuit is configured to determine the program state based on a weighting associated with the distribution function.

17. The system of claim 15, wherein the distribution function is configured to provide a uniform distribution of data values in the unit of the memory.

18. The system of claim 15, wherein the distribution function is configured to randomize distribution of values in the unit of the memory.

19. The system of claim 14, wherein the program state determiner circuit is configured to determine a proportion of cells in the unit having a threshold voltage meeting a predetermined criterion.

20. The system of claim 14, wherein the program state determiner circuit is configured to determine a proportion of cells having an erased state.

21. The system of claim 14, wherein the program state determiner circuit is configured to determine a number of cells in the unit having a predetermined state and to determine the program state by comparison of the determined number of cells to a predetermined criterion.

22. The system of claim 14, wherein the program state determiner circuit is configured to determine the program state of the unit of the memory based on the determined proportion of the at least one cell state without determining a status of a program state flag.

23. The system of claim 14, wherein the memory further comprises at least one cell configured to store a program state flag and wherein the program state determiner circuit is configured to determine the program state of the unit of the memory based on the determined proportion of the at least one cell state responsive to a failure to identify the program state of the unit based on a program state flag.

24. The system of claim 14, wherein the memory further comprises at least one cell configured to store a program state flag, wherein the unit of the memory comprises a plurality of multi-bit memory cells and wherein the program state determiner circuit is configured to determining a program state of the unit of the memory for a first bit level based on the determined proportion of the at least one cell state and to determine a program state of the unit of the memory for a second bit level based on the program state flag.

25. The system of claim 14, wherein the memory further comprises at least one cell configured to store a program state flag and wherein the program state determiner circuit is configured to determine the program state of the unit of the memory based on the determined proportion of the at least one cell state and the program state flag.

26. The system of claim 14, wherein the memory is further configured to control a read operation and/or a write operation responsive to the determined program state.

27. The system of claim 14, wherein the memory is included in a first integrated circuit device and wherein the program state determiner circuit is part of a memory controller included in a second integrated circuit device.

28. The system of claim 14, wherein the memory and the program state determiner are included in a single integrated circuit device.

* * * * *